US009906203B2

United States Patent
Cho et al.

(10) Patent No.: US 9,906,203 B2
(45) Date of Patent: Feb. 27, 2018

(54) COMMON MODE FILTER AND ELECTRONIC DEVICE INCLUDING THE SAME

(71) Applicant: SAMSUNG ELECTRO-MECHANICS CO., LTD., Suwon (KR)

(72) Inventors: Jeong Min Cho, Sungnam (KR); Won Chul Sim, Sungnam (KR); Hye Won Bang, Suwon (KR); Geon Se Chang, Seoul (KR); Kwang Mo Kim, Seoul (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 266 days.

(21) Appl. No.: 14/552,849

(22) Filed: Nov. 25, 2014

(65) Prior Publication Data
US 2015/0145618 A1    May 28, 2015

(30) Foreign Application Priority Data

Nov. 26, 2013 (KR) .................. 10-2013-0144676
Nov. 5, 2014 (KR) .................. 10-2014-0152533

(51) Int. Cl.
*H03H 7/01* (2006.01)
*H03H 7/42* (2006.01)
(Continued)

(52) U.S. Cl.
CPC ............ *H03H 7/427* (2013.01); *H02H 9/045* (2013.01); *H03H 7/0115* (2013.01); *H03H 2001/0085* (2013.01)

(58) Field of Classification Search
CPC ........... H03H 7/427; H03H 2001/0085; H03H 7/0115; H02H 9/045
(Continued)

(56) References Cited

U.S. PATENT DOCUMENTS 6,094,112 A * 7/2000 Goldberger ............... H03H 3/00
                                                                        333/184
2004/0070468 A1 * 4/2004 Harada ................ H01P 1/20345
                                                                        333/185
(Continued)

FOREIGN PATENT DOCUMENTS

JP     2003-318687 A    11/2003
JP     2011-091169 A     5/2011
(Continued)

OTHER PUBLICATIONS

Japanese Office Action dated Jan. 31, 2017 issued in Japanese Patent Application No. 2014-237490 (with English translation).

*Primary Examiner* — Rakesh Patel
(74) *Attorney, Agent, or Firm* — McDermott Will & Emery LLP

(57) ABSTRACT

A common mode filter in which at least one surface of all of external electrodes and ground electrodes are exposed to a first surface, at least one side of each of two of the external electrodes and at least one side of one of the ground electrodes contact a first side of the first surface, and at least one side of each of the external electrodes and the ground electrodes of which sides do not contact the first side contact a second side of the first surface, thereby making it possible to improve sticking strength and decrease a short-circuit phenomenon occurrence rate.

24 Claims, 8 Drawing Sheets

(51) Int. Cl.
 *H02H 9/04* (2006.01)
 *H03H 1/00* (2006.01)
(58) Field of Classification Search
 USPC .................................. 333/181, 185, 4, 5
 See application file for complete search history.

(56) References Cited

U.S. PATENT DOCUMENTS

| | | |
|---|---|---|
| 2009/0154052 A1 | 6/2009 | Yoneda et al. |
| 2011/0007439 A1* | 1/2011 | Asakawa ............ H01F 17/0006 |
| | | 361/56 |
| 2013/0265131 A1 | 10/2013 | Yang et al. |
| 2014/0266507 A1* | 9/2014 | Fauer ...................... H02M 1/10 |
| | | 333/181 |
| 2014/0312991 A1* | 10/2014 | Tan .......................... H01G 4/30 |
| | | 333/184 |

FOREIGN PATENT DOCUMENTS

| | | |
|---|---|---|
| JP | 2012-33976 | 2/2012 |
| JP | 2013-219029 A | 10/2013 |
| WO | 2007/029615 A1 | 3/2007 |

\* cited by examiner

COMMON MODE FILTER AND ELECTRONIC DEVICE INCLUDING THE SAME

CROSS REFERENCE(S) TO RELATED APPLICATIONS

This application claims the foreign priority benefit under 35 U.S.C. Section 119 of Korean Patent Application No. 10-2013-0144676, filed Nov. 26, 2013, and Korean Patent Application No. 10-2014-0152533, filed Nov. 5, 2014, the entire disclosures of which are hereby incorporated by reference in their entirety into this application.

BACKGROUND

The present disclosure relates to a common mode filter and an electronic device including the same.

A common mode filter is an electronic component that has been widely used in various electronic devices in order to remove common mode noise.

Recently, in accordance with the trend toward miniaturization, slimness, and multi-functionalization of electronic products, research into a common mode filter capable of being miniaturized and thinned simultaneously with improving noise removing performance has been continuously conducted.

Meanwhile, a high speed digital interface transmits data using a signal having a high transmission rate, and integrated circuits treating this signal are very sensitive to static electricity. Therefore, a means that may rapidly remove the static electricity should be provided in the vicinity of the integrated circuits sensitive to the static electricity as described above. That is, a component rapidly inducing an over-voltage applied to a signal path to a ground terminal is required. This component is called an electrostatic discharge (ESD) protecting component.

SUMMARY

An object of the present disclosure is to provide a common mode filter capable of sufficiently securing sticking strength to a target to be mounted, improving signal transmission efficiency, and decreasing a short-circuit phenomenon.

Another object of the present disclosure is to provide an electronic device including a common mode filter capable of firmly fixing a common mode filter thereto, improving signal transmission efficiency, efficiently removing an over-voltage at the time of generation of static electricity, and decreasing a short-circuit phenomenon.

According to an embodiment of the present disclosure, there is provided a common mode filter including a discharge part and a coil part provided between a pair of magnetic materials and having a hexahedral shape, the discharge part discharging an over-voltage applied between discharge patterns and ground patterns and the coil part including coils formed by disposing conductive patterns in a spiral shape, the common mode filter including: at least four external electrodes electrically connected to the coils and the discharge patterns; and at least two ground electrodes connected to the ground patterns, wherein all of at least one surfaces of each of the external electrodes and the ground electrodes are exposed to a first surface, which is at least one surface of six surfaces of the common mode filter, and all of one sides of each of two of the external electrodes and one of the ground electrodes contact a first side, which is one side of the first surface.

All of external electrodes and ground electrodes of which one sides do not contact the first side among the external electrodes and the ground electrodes may contact a second side opposing the first side.

The first surface may include third and fourth sides having lengths shorter than that of the first side.

Sides that contact the first or second side among sides of each of the external electrodes may have lengths longer than those of sides that do not contact the first or second side among the sides of each of the external electrodes.

At least one side of each of the external electrodes may contact at least one side except for the first or second side among sides of the first surface.

At least one side of each of the external electrodes may contact the third or fourth side.

At least one of the external electrodes may include a surface exposed to a third surface sharing the first side with the first surface.

At least one of the external electrodes may include: a surface exposed to at least one of a fifth surface sharing the third side with the first surface and a sixth surface sharing the fourth side with the first surface; and a surface exposed to a third surface sharing the first side with the first surface.

A ratio between a width and a length of the external electrode may be 0.9 to 1.1 times the ratio between a width and a length of the first surface.

A width of the external electrode in a direction that is in parallel with the first side may be 0.15 to 0.4 times the length of the first surface.

A minimum value of a length of one side of the ground electrode may be 0.15 times or more the length of the shortest side among sides of the first surface.

The discharge part may include: connecting electrodes electrically connected to the discharge patterns; ground terminals contacting the ground electrodes; and a connection pattern electrically connecting the ground terminals and the ground patterns to each other, the connection pattern, the discharge patterns, and the ground patterns being provided outside a vertical projection region of a region in which the coils are formed in the coil part.

According to another embodiment of the present disclosure, there is provided a common mode filter including: four external electrodes; and two ground electrodes, wherein a first surface of the common mode filter includes a first side, a second side opposing the first side, a third side, and a fourth side opposing the third side, one surfaces of all of the external electrodes and the ground electrodes are exposed to the first surface, one sides of each of two of the external electrodes and one of the ground electrodes contact the first side, and one sides of each of electrodes of which one sides do not contact the first side among the external electrodes and the ground electrodes contact the second side.

At least one side selected among sides that do not contact the first or second side among sides of each of the external electrodes may contact the third or fourth side.

The first and second sides may have lengths longer than those of the third and fourth sides.

Each of sides that contact the first or second side among the sides of each of the external electrodes may have a length longer than that of each of sides that contact the third or fourth side among the sides of each of the external electrodes.

According to still another embodiment of the present disclosure, there is provided a common mode filter having a hexahedral shape including a first surface of which a horizontal side is larger than a vertical side, including: four external electrodes; and two ground electrodes, wherein the four external electrodes are positioned at four corners of the first surface, respectively, to share two sides of each thereof with the first surface, and the two ground electrodes share a horizontal side of the first surface with each other and are disposed between the external electrodes so as to be spaced apart from the external electrodes.

According to yet still another embodiment of the present disclosure, there is provided a common mode filter including: a base part made of a magnetic material; a coil part provided on the base part and including coils formed by disposing conductive patterns in a spiral shape and external terminals connected to end portions of the coils; a discharge part provided on the coil part and including connecting terminals contacting the external terminals, discharge patterns electrically connected to the connecting terminals, ground patterns spaced apart from the discharge pattern by a predetermined interval, and ground terminals electrically connected to the ground patterns; and a cover part including external electrodes provided on the discharge part and contacting the connecting terminals, ground electrodes provided on the discharge part and contacting the ground terminals, and a magnetic material part filled between the connecting teiminal and the ground terminals to cover the discharge part, wherein all of the external electrodes and the ground electrodes are exposed to an upper surface of the cover part, and horizontal sides of the external electrodes and horizontal sides of the ground electrodes are positioned on horizontal sides on the upper surface of the cover part.

The discharge part may further include a connection pattern electrically connecting the ground terminals and the ground patterns to each other, the connection pattern, the discharge patterns, and the ground patterns being provided outside a vertical projection region of a region in which the coils are formed in the coil part.

According to yet still another embodiment of the present disclosure, there is provided a common mode filter including: a base part made of a magnetic material; a first primary external terminal provided at one end of a primary coil; a second primary external terminal provided at the other end of the primary coil; a first secondary external terminal provided at one end of a secondary coil magnetically coupled to the primary coil; a second secondary external terminal provided at the other end of the secondary coil; a first discharge pattern electrically connected to the first primary external terminal; a second discharge pattern electrically connected to the second primary external terminal; a third discharge pattern electrically connected to the first secondary external terminal; a fourth discharge pattern electrically connected to the second secondary external terminal; a first ground pattern spaced apart from the first discharge pattern by a predetermined interval; a second ground pattern spaced apart from the second discharge pattern by a predetermined interval; a third ground pattern spaced apart from the third discharge pattern by a predetermined interval; a fourth ground pattern spaced apart from the fourth discharge pattern by a predetermined interval; a connection pattern electrically connected to the first to fourth ground patterns; a first ground terminal electrically connected to the connection pattern; a second ground terminal provided so as to oppose the first ground terminal and electrically connected to the connection pattern; a first primary external electrode electrically connected to the first primary external terminal and the first discharge pattern; a second primary external electrode electrically connected to the second primary external terminal and the second discharge pattern; a first secondary external electrode electrically connected to the first secondary external terminal and the third discharge pattern; a second secondary external electrode electrically connected to the second secondary external terminal and the fourth discharge pattern; a first ground electrode contacting the first ground terminal; a second ground electrode contacting the second ground terminal; and a magnetic material part filled between the first primary external electrode, the second primary external electrode, the first secondary external electrode, the second secondary external electrode, the first ground electrode, and the second ground electrode, wherein upper surfaces and two side surfaces of each of the first primary external electrode, the second primary external electrode, the first secondary external electrode, and the second secondary external electrode are exposed to the outside of the magnetic material part, and the first ground electrode is positioned between two external electrodes selected among the first primary external electrode, the second primary external electrode, the first secondary external electrode, and the second secondary external electrode, and the second ground electrode is positioned between the other two external electrodes.

Upper surfaces and one side surfaces of each of the first and second ground electrodes may be exposed to the outside of the magnetic material part.

Two sides each contacting the first and second ground electrodes among four sides forming an upper surface of the common mode filter may oppose each other.

Two sides each contacting the first and second ground electrodes among four sides forming an upper surface of the common mode filter may have lengths longer than those of the other two sides among the four sides forming the upper surface of the common mode filter.

The first ground electrode may be positioned between the first primary external electrode and the first secondary external electrode, and the second ground electrode may be positioned between the second secondary external electrode and the second primary external electrode.

According to yet still another embodiment of the present disclosure, there is provided an electronic device including the common mode filter including: the common mode filter as described above; signal path patterns to which each of the external electrodes of the common mode filter is electrically connected; a ground path pattern to which each of the ground electrodes of the common mode filter is electrically connected; and an insulating substrate having the signal path patterns and the ground path pattern provided thereon.

The electronic device including the common mode filter may further include conductive solder pastes electrically connecting each of the external electrodes to the signal path patterns, electrically connecting each of the ground electrodes to the ground path pattern, and physically fixing the common mode filter to the insulating substrate.

DESCRIPTION OF THE PREFERRED EMBODIMENTS

Figure 1A:
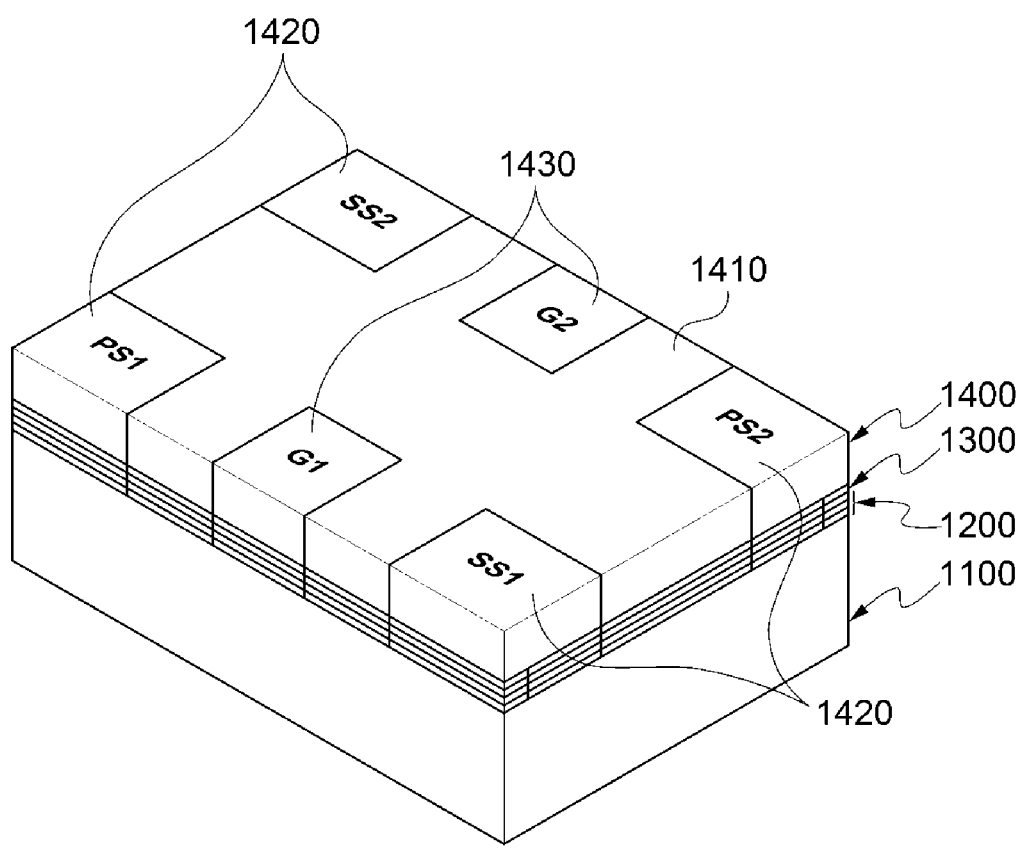
FIG. 1A is a perspective view schematically showing a common mode filter according to an embodiment of the present disclosure.

Various advantages and features of the present disclosure and methods accomplishing them will become apparent from the following description of various embodiments with reference to the accompanying drawings. However, the present disclosure is not limited to embodiments set forth herein, but may be modified in many different forms. Like reference numerals throughout the description denote like elements.

Terms used in the present specification are for explaining embodiments rather than limiting the present disclosure. Unless explicitly described to the contrary, a singular form includes a plural form in the present specification. The word "comprise" and variations such as "comprises" or "comprising," will be understood to imply the inclusion of stated constituents, steps, operations and/or elements, but not the exclusion of any other constituents, steps, operations and/or elements.

For simplification and clearness of illustration, a general configuration scheme will be shown in the accompanying drawings, and a detailed description of the feature and the technology well known in the art will be omitted in order to prevent a discussion of embodiments of the present disclosure from being unnecessarily obscure. Additionally, components shown in the accompanying drawings are not necessarily shown to scale. For example, sizes of some components shown in the accompanying drawings may be exaggerated as compared with other components in order to assist in understanding of embodiments of the present disclosure. Like reference numerals on different drawings will denote like components, and similar reference numerals on different drawings will denote similar components, but are not necessarily limited thereto.

In the specification and the claims, terms such as "first", "second", "third", "fourth", and the like, if any, will be used to distinguish similar components from each other and be used to describe a specific sequence or a generation sequence, but is not necessarily limited thereto. It may be understood that these terms are compatible with each other under an appropriate environment so that embodiments of the present disclosure to be described below may be operated in a sequence different from a sequence shown or described herein. Likewise, in the present specification, in the case in which it is described that a method includes a series of steps, a sequence of these steps suggested herein is not necessarily a sequence in which these steps may be executed. That is, any described step may be omitted and/or any other step that is not described herein may be added to the method.

In the specification and the claims, terms such as "left", "right", "front", "rear", "top", "bottom", "over", "under", and the like, if any, do not necessarily indicate relative positions that are not changed, but are used for description. It may be understood that these terms are compatible with each other under an appropriate environment so that embodiments of the present disclosure to be described below may be operated in a direction different from a direction shown or described herein. A term "connected" used herein is defined as being directly or indirectly connected in an electrical or non-electrical scheme. Targets described as being "adjacent to" each other may physically contact each other, be close to each other, or be in the same general range or region, in the context in which the above phrase is used. Here, a phrase "in an embodiment" means the same embodiment, but is not necessarily limited thereto.

Hereinafter, a configuration and an acting effect of various embodiments of the present disclosure will be described in more detail with reference to the accompanying drawings.

Figure 1B:
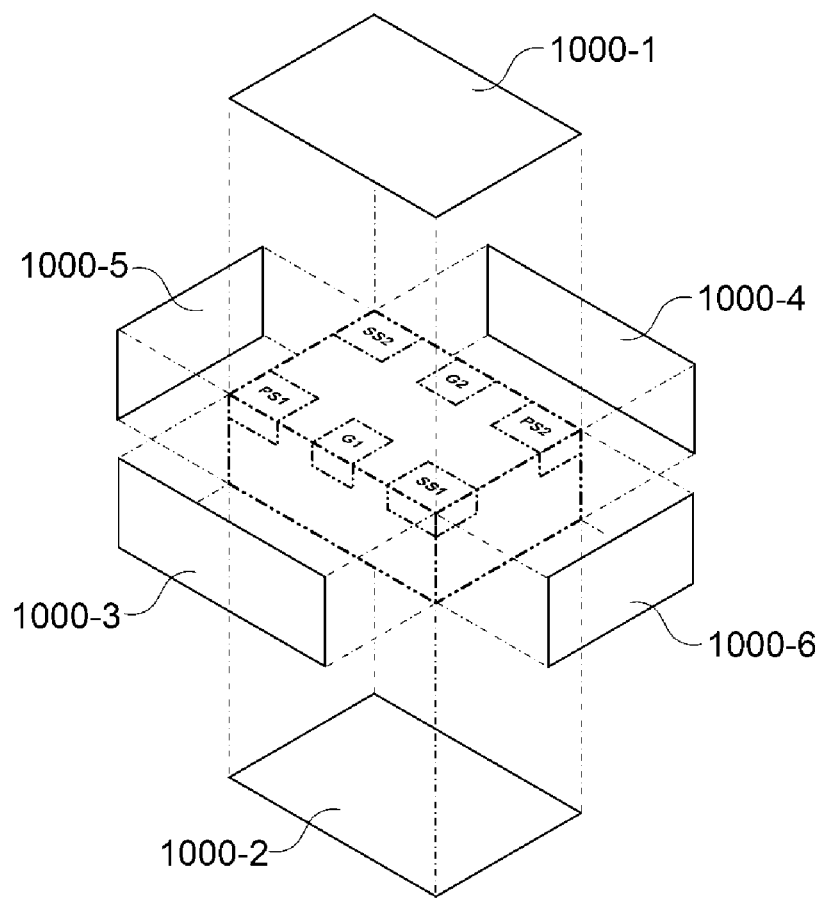
FIG. 1B is a perspective view schematically showing a disposition relationship between the respective surfaces of the common mode filter of FIG. 1A.
Figure 2:
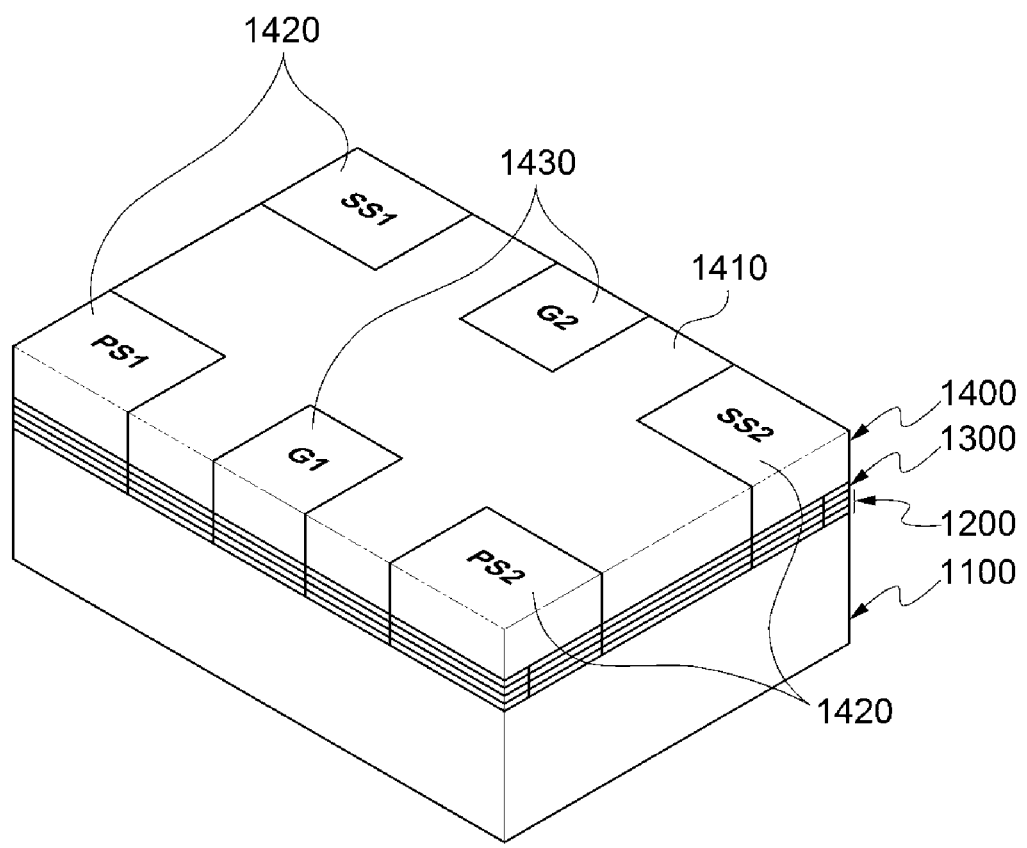
FIG. 2 is a perspective view schematically showing a common mode filter according to a modified example of FIG. 1A.
Figure 3:
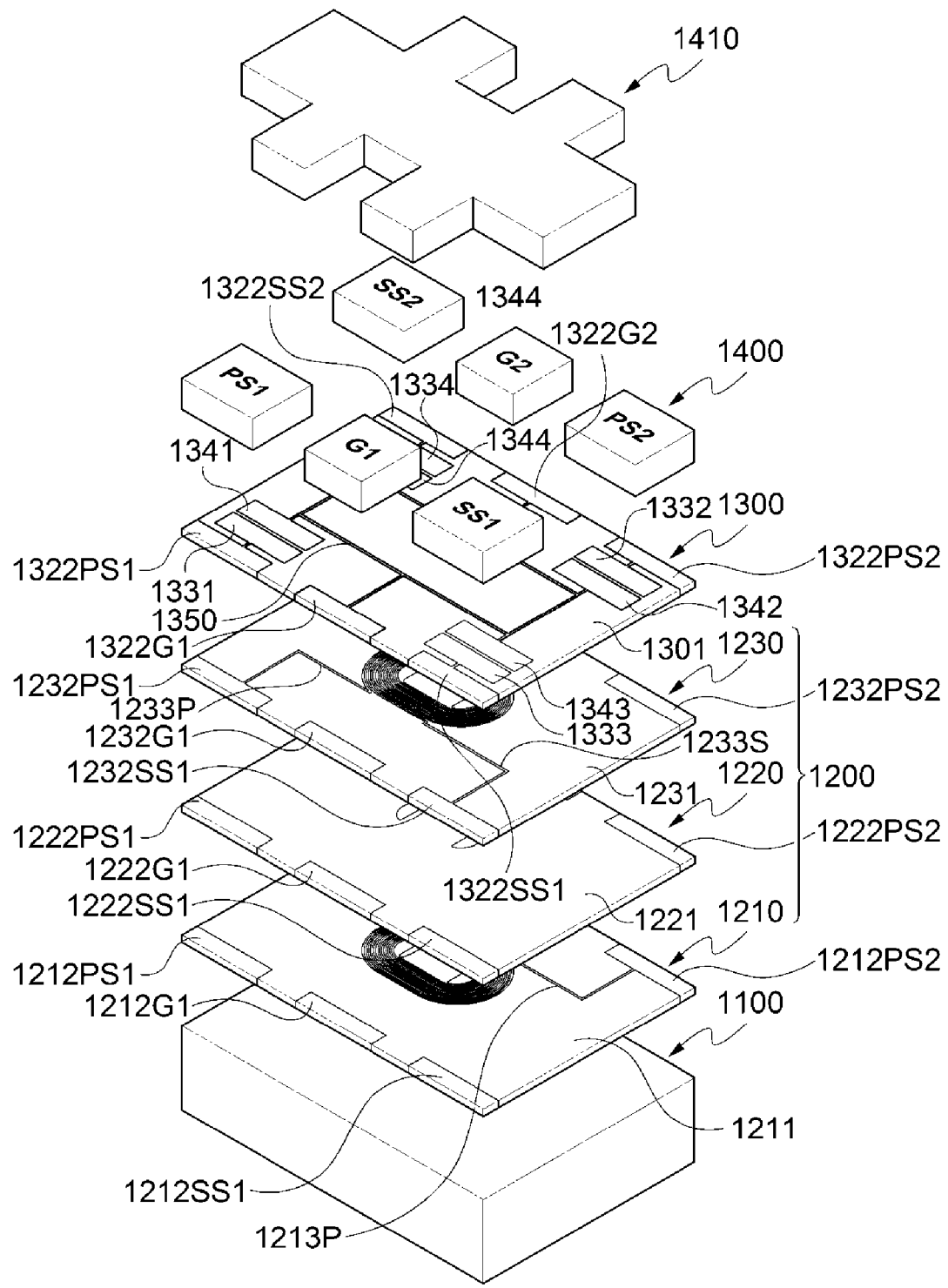
FIG. 3 is an exploded perspective view schematically showing the common mode filter according to an embodiment of the present disclosure.
Figure 4:
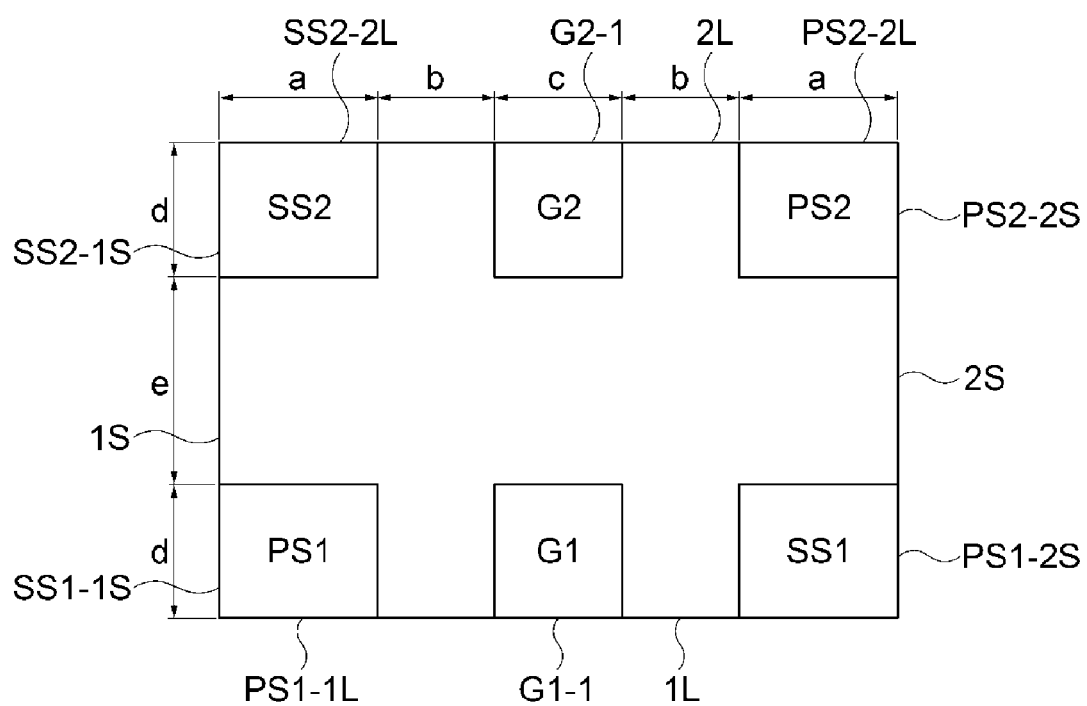
FIG. 4 is a plan view schematically showing the common mode filter according to an embodiment of the present disclosure.

FIG. 1A is a perspective view schematically showing a common mode filter 1000 according to an embodiment of the present disclosure; FIG. 1B is a perspective view schematically showing a disposition relationship between the respective surfaces of the common mode filter 1000 of FIG. 1A; FIG. 2 is a perspective view schematically showing a common mode filter 2000 according to a modified example of FIG. 1A; FIG. 3 is an exploded perspective view schematically showing the common mode filter 1000 according to an embodiment of the present disclosure; and FIG. 4 is a plan view schematically showing the common mode filter 1000 according to an embodiment of the present disclosure.

Referring to FIGS. 1A, 1B, and 2 to 4, the common mode filter 1000 according to an embodiment of the present disclosure may be configured to include a base part 1100, a coil part 1200, a discharge part 1300, and a cover part 1400.

Here, the base part 1100 may be made of a magnetic material.

Next, the coil part 1200 may include coils and external terminals. Here, the coils and the external terminals may be formed on one surface or both surfaces of an insulating part, and the external terminals may be formed so as to penetrate through the insulating part. In addition, the coils may be formed by forming conductive patterns in a spiral shape, and the external terminals may be connected to one ends of the coils.

In an embodiment of the present disclosure, the coils and the external terminals may be formed on the same plane. Further, internal terminals may be connected to the other ends of the coils.

In addition, two or more insulating parts on which the coils and the external terminals are formed may be stacked to form the coil part 1200. Here, the coils formed on different layers further include vias (not shown) contacting the internal terminals, or the like, such that they may be electrically connected to each other.

In addition, the external terminals, the internal terminals, or the like, may be formed so as to penetrate between upper and lower surfaces of the insulating part and be then exposed in both of an upper surface direction and a lower surface direction of the insulating part.

Further, coil patterns may be formed so as to be exposed in only any one of the upper surface direction and the lower surface direction of the insulating part.

Here, although not shown, a primary coil may be formed on one layer, and a secondary coil may be formed on another layer.

A detailed description will be provided with reference to FIG. 3. The coil part 1200 may include a first coil layer 1210, a second coil layer 1220, and a third coil layer 1230.

The first coil layer 1210 will be first described. A primary coil 1213P and a secondary coil are wound on a first insulating part 1211 in a state in which they are spaced apart from each other by a predetermined interval, such that a coil may be formed.

In addition, a second primary external terminal 1212PS2 may be connected to one end of the primary coil 1213P. Although not shown in FIG. 3, a second secondary external terminal 1212SS2 may be connected to one end of the secondary coil. In addition, a second ground terminal 1212G2 may be provided between a second primary external terminal 1212PS2 and a second secondary external terminal 1212SS2.

In addition, the first coil layer 1210 may be further provided with a first primary external terminal 1212PS1, a first secondary external terminal 1212SS1, and a first ground terminal 1212G1.

Meanwhile, on the first coil layer 1210, internal terminals may be connected to the other ends of the primary coil 1213P and the secondary coil.

Next, the third coil layer 1230 will be described. Coils, external terminals, and ground terminals may be formed on a third insulating part 1231 to implement the third coil layer 1230.

That is, a primary coil 1233P is connected to a first primary external terminal 1232PS1, and a second coil 1233S is connected to a first secondary external terminal 1232SS1. In addition, a coil having a spiral shape may be formed in a state in which the primary coil 1233P and the secondary coil 1233S are spaced apart from each other by a predetermined interval.

Here, a first ground terminal 1232G1 may be further provided between a first primary external terminal 1232PS1 and a first secondary external terminal 1232SS1.

In addition, the third coil layer 1230 may be further provided with a second primary external terminal 1232PS2 and a second secondary external terminal, and a second ground terminal may be further provided between the second primary external terminal 1232PS2 and the second secondary external terminal.

Meanwhile, on the third coil layer 1230, internal terminals may be connected to the other ends of the primary coil 1233P and the secondary coil 1233S.

Next, the second coil layer 1220 will be described. A first primary external terminal 1222PS1, a first ground terminal 1222G1, a first secondary external terminal 1222SS1, a second primary external terminal 1222PS2, a second secondary external terminal, and a second ground terminal may be provided on a second insulating layer 1221 to implement the second coil layer 1220. Here, the second coil layer 1220 may not be provided with a separate coil, but be provided with internal terminals formed at positions corresponding to those of the internal terminals provided on the first and third coil layers 1210 and 1230.

Meanwhile, the discharge part 1300 may include discharge patterns 1331, 1332, 1333, and 1334, ground patterns 1341, 1342, 1343, and 1344, a ground terminal, and a connection pattern 1350 provided on a fourth insulating part 1301, and may further include connecting terminals.

A first primary connecting terminal 1322PS1, a second primary connecting terminal 1322PS2, a first secondary connecting terminal 1322SS1, and a second secondary connecting terminal 1322SS2 may be formed at positions corresponding to those of each of the first primary external terminal 1232PS1 to the second secondary external terminal 1232SS2 formed in the coil part 1200.

In addition, the first discharge pattern 1331 is connected to the first primary connecting terminal 1322PS1, such that it may be electrically connected to the first primary external terminal 1232PS1. In addition, the second discharge pattern 1332 is connected to the second primary connecting terminal 1322PS2, such that it may be electrically connected to the second primary external terminal 1232PS2.

In addition, the third discharge pattern 1333 is connected to the first secondary connecting terminal 1322SS1, such that it may be electrically connected to the first secondary external terminal 1232SS1. In addition, the fourth discharge pattern 1334 is connected to the second secondary connecting terminal 1322SS2, such that it may be electrically connected to the second secondary external terminal 1232SS2.

Meanwhile, the first ground pattern 1341 may be formed so as to be spaced apart from the first discharge pattern 1331 by a predetermined interval, the second ground pattern 1342 may be formed so as to be spaced apart from the second discharge pattern 1332 by a predetermined interval, the third ground pattern 1343 may be formed so as to be spaced apart from the third discharge pattern 1333 by a predetermined interval, and the fourth ground pattern 1344 may be formed so as to be spaced apart from the fourth discharge pattern 1334 by a predetermined interval.

Therefore, in the case in which an over-voltage is applied to the respective external terminals, the over-voltage may be discharged from the discharge patterns 1331 to 1334 electrically connected to the respective external terminals to the ground patterns 1341 to 1344.

In addition, the first to fourth ground patterns 1341 to 1344 may be connected to a first ground terminal 1322G1 or a second ground terminal 1322G2 by the connection pattern 1350. Therefore, the discharged over-voltage may move to the first or second ground terminal 1322G1 or 1322G2.

Here, as shown in FIG. 3, the connection pattern 1350, the discharge patterns 1331 to 1334, and the ground patterns 1341 to 1344 may be provided outside a vertical projection region of a region in which the coils are wound.

Therefore, a problem that a flow of a magnetic flux generated in the coil is hindered or disturbed due to the discharge part 1300 may be decreased.

In addition, external electrodes 1420 and ground electrodes 1430 are exposed to the same surface, such that an area required for mounting the common mode filter 1000 on an insulating substrate 3100, or the like, may be decreased, thereby making it possible to result in being in accordance with the trend toward miniaturization of an electronic product.

Meanwhile, the external electrodes 1420 may be electrically connected to the above-mentioned external terminals, and the ground electrodes 1430 may be electrically connected to the above-mentioned ground terminals.

Here, lower surfaces of each of the external electrodes 1420 may directly contact the connecting electrodes provided in the discharge part 1300, and the first coil layer 1210, the second coil layer 1220, the third coil layer 1230, and the discharge part 1300 are stacked while contacting each other in a vertical direction, such that the external electrodes 1420 may be electrically connected to the external terminals, respectively. In addition, the ground electrodes 1430 may be electrically connected to the ground terminals, respectively.

In addition, here, the external electrodes 1420 may directly contact discharge patterns 1330, respectively, simultaneously with directly contacting the connecting electrodes, respectively.

In addition, here, the external electrodes 1420 may directly contact discharge patterns 1330, respectively, simultaneously with directly contacting the dummy external electrodes, respectively.

Next, a magnetic material part 1410 is provided on the discharge part 1300. Here, spaces between the external electrodes 1420 and the ground electrodes 1430 are also filled with the magnetic material part 1410.

Here, the magnetic material part 1410 may be made of a magnetic material, similar to the base part 1100.

In addition, the magnetic material part 1410 may also be made of a magnetic composite in which magnetic materials such as ferrite, or the like, are mixed with a synthetic resin.

The common mode filter 1000 may have a hexahedral shape, and a width and a length of the common mode filter 1000 may be the same as or different from each other.

Meanwhile, standards of electronic components are generally standardized in order to promote convenience in a designing a circuit board.

For example, in a chip type electronic component such as an inductor, the common mode filter 1000, or the like, the case in which width×length×height is 0.65 mm×0.50 mm×0.35 mm is an example of a standardized standard and is commonly called a "0605" standard.

In addition, the case in which width×length×height is 0.40 mm×0.30 mm×0.23 mm is an example of a standardized standard and is commonly called a "0403" standard.

As described above, in the standardized common mode filter 1000, a width is generally longer than a length. Therefore, in the accompanying drawings, a width has been shown to be longer than a length. However, this is only to assist in the understanding, and does not exclude the case in which a length is longer than a width or a width and a length are the same as each other.

In addition, referring to FIG. 1B, each surface of the common mode filter 1000 having the hexahedral shape has been defined in order to assist in the understanding of the common mode filter 1000 according to an embodiment of the present disclosure.

Hereinafter, in FIG. 1B, a surface denoted by a reference numeral 1000-1 will be called a first surface, a surface denoted by a reference numeral 1000-2 will be called a second surface, a surface denoted by a reference numeral 1000-3 will be called a third surface, a surface denoted by a reference numeral 1000-4 will be called a fourth surface, a surface denoted by a reference numeral 1000-5 will be called a fifth surface, and a surface denoted by a reference numeral 1000-6 will be called a sixth surface.

In addition, a plane shape of the first surface is shown in FIG. 4. In FIG. 4, a side denoted by 1L will be called as a first side, a side denoted by 2L will be called a second side, a side denoted by 1S will be called a third side, and a side denoted by 2S will be called as a fourth side.

In addition, the first and second sides may be understood as horizontal sides, and the third and fourth sides may be understood as vertical sides.

This may be similarly applied to the external electrodes 1420 and the ground electrodes 1430.

In the common mode filter 1000 according to an embodiment of the present disclosure, all of upper surfaces of the external electrodes 1420 and the ground electrodes 1430 may be exposed to the first surface.

In addition, two external electrodes PS1 and SS1 and one ground electrode G1 may be disposed so as to contact the horizontal side, that is, the first side, of the first surface. In addition, the other two external electrodes SS2 and PS2 and one ground electrode G2 may be disposed so as to contact the second side opposing the first side.

In addition, the ground electrodes 1430 may be positioned between the external electrodes 1420.

In addition, the external electrodes 1420 may be positioned at corners on the first surface, respectively.

Therefore, distances between the external electrodes 1420 and the ground electrodes 1430 and distances between the external electrodes 1420 may be maximized.

That is, a first primary external electrode PS1 may be disposed so that two sides thereof contact the first and third sides, a second primary external electrode PS2 may be disposed so that two sides thereof contact the second and fourth sides, a first secondary external electrode SS1 may be disposed so that two sides thereof contact the first and fourth sides, and a second secondary external electrode SS2 may be disposed so that two sides thereof contact the second and third sides.

In addition, a first ground electrode G1 may contact the first side, and a second ground electrode G2 may contact the second side.

Again referring to FIGS. 1A and 1B, the external electrodes 1420 are positioned at the corners of the first surface of the common mode filter 1000, respectively, such that three surfaces thereof may be exposed to outer surfaces of the common mode filter 1000.

That is, the first primary external electrode PS1 may be exposed to the first surface, the third surface, and the fifth surface. Likewise, the first secondary external electrode SS1, the second primary external electrode PS2, and the second secondary external electrode SS2 may also be exposed to three surfaces.

In addition, the ground electrodes 1430 contact the first and second sides of the first surface of the common mode filter 1000, respectively, such that two surfaces thereof may be exposed to outer surfaces of the common mode filter 1000.

That is, the first ground electrode G1 may be exposed to each of the first and third surfaces of the common mode filter 1000, and the second ground electrode G2 may be exposed to each of the first and fourth surfaces of the common mode filter 1000.

Therefore, since the distances between the external electrodes 1420 and the ground electrodes 1430 may be maximized, a risk that a short-circuit will occur between the electrodes in mounting the common mode filter 1000 on the insulating substrate 3100, or the like, may be decreased.

In addition, in mounting the common mode filter 1000 on the insulating substrate 3100, or the like, as an area in which the external electrodes 1420 are each connected to conductive patterns on the insulating substrate 3100 becomes large, the common mode filter 1000 may be more firmly fixed, and transfer efficiency of an electrical signal may also be increased.

Therefore, in the common mode filter 1000 according to an embodiment of the present disclosure, since the distances between the external electrodes 1420 and the ground electrodes 1430 may be maximized, widths of the electrodes may be maximized without occurrence of a short-circuit phenomenon between the electrodes under the same condition. As a result, sticking strength and signal transmission efficiency of the common mode filter 1000 may be improved, and the short-circuit phenomenon may be minimized.

In addition, in the common mode filter 1000 according to an embodiment of the present disclosure, since the external electrodes 1420 may be fixed to the insulating substrate 3100, or the like, using three surfaces, the sticking strength may be further improved, and the signal transmission efficiency may be further improved.

Figure 5:
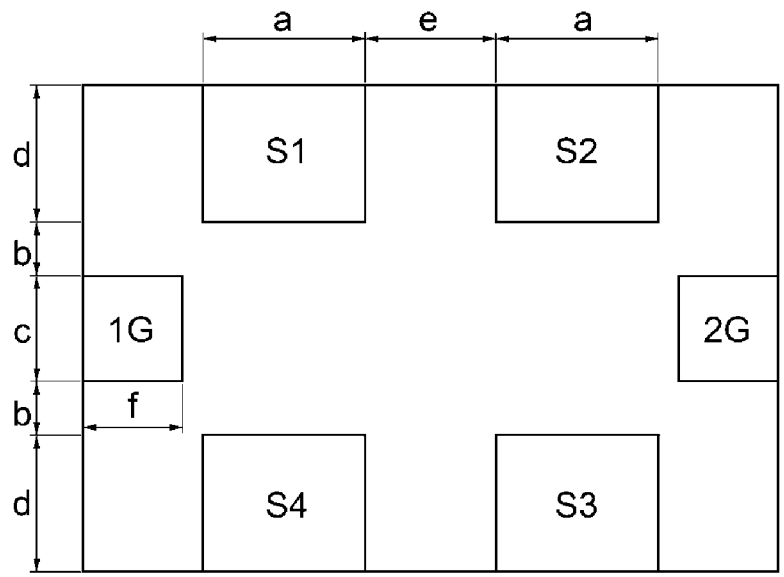
FIG. 5 is a plan view schematically showing a common mode filter according to Comparative Example 1.
Figure 6:
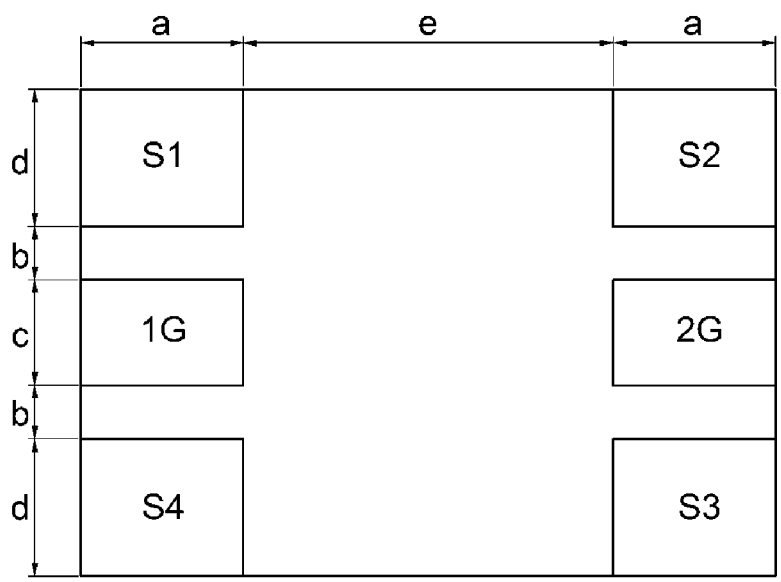
FIG. 6 is a plan view schematically showing a common mode filter according to Comparative Example 2.
Figure 7:
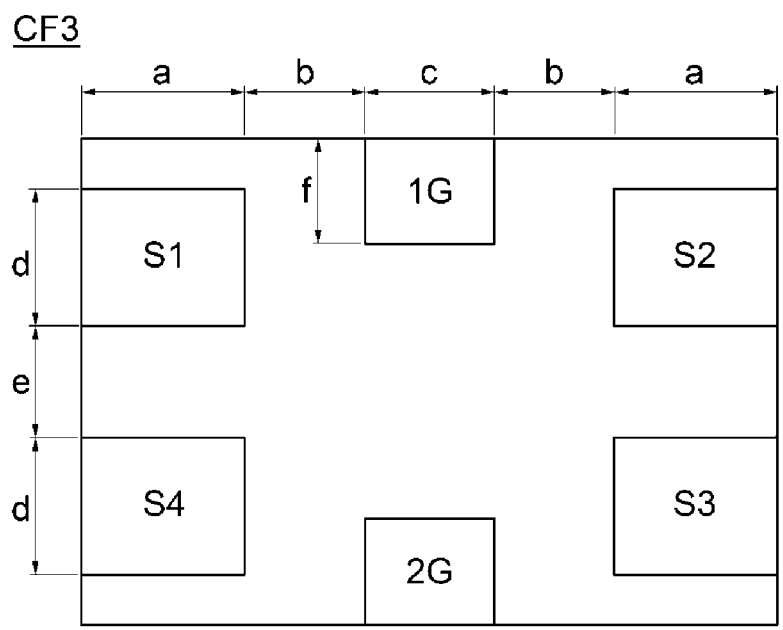
FIG. 7 is a plan view schematically showing a common mode filter according to Comparative Example 3.

FIGS. 5 to 7 are plan views schematically showing common mode filters according to Comparative Examples 1 to 3.

In addition, Table 1 is a table showing measurement results for sticking strength and the number of occurrences of short-circuits that are measured while changing widths, lengths, and intervals of external electrodes and ground electrodes in common mode filters according to Comparative Examples 1 to 3 and the common mode filter 1000 according to an embodiment of the present disclosure shown in FIG. 4.

Here, common mode filters have been manufactured so as to have a "0605" standard, that is, a size corresponding to width×length×height of 0.65 mm×0.50 mm×0.35 mm.

In addition, MODEL1 means the common mode filter according to Comparative Example 1, MODEL2 means the common mode filter according to Comparative Example 2, MODEL3 means the common mode filter according to Comparative Example 3, and MODEL4 means the common mode filter 1000 shown in FIG. 4.

between the external electrodes 1420 or between the external electrodes 1420 and the ground electrodes 1430 in a process of coupling the common mode filter 1000 to the insulating substrate 3100, or the like.

Therefore, it is preferable that the widths of the external electrodes 1420 are 0.4 times or less the width of the common mode filter 1000. In addition, it is preferable that the lengths of the external electrodes 1420 are 0.4 times or less the length of the common mode filter 1000.

In addition, when a mounting error is considered, it is preferable that the lengths of the ground electrodes 1430 are also 0.15 times or more the length of the common mode filter 1000 in order to stably connect the ground electrodes 1430 to conductive patterns formed on the insulating substrate 3100.

Further, it is preferable that sizes of the external electrodes 1420 and sizes of the ground electrodes 1430 are appropriately adjusted in a predetermined range since a problem that a fixed position of the common mode filter 1000 is distorted, or the like, may occur in a reflow process when a deviation between the sizes of the external electrodes 1420 and the ground electrodes 1430 becomes excessively large.

As shown in Table 1, when an interval b between the external electrode and the ground electrode is 100 μm or less, a short-circuit occurrence rate tends to be increased.

In addition, as the width of the external electrode becomes large, sticking strength tends to be improved.

Meanwhile, in the case of the common mode filters according to Comparative Examples 1 and 2, a width a of the

TABLE 1

| Division | SPL# | a (μm) | b (μm) | c (μm) | d (μm) | e (μm) | f (μm) | Sticking strength (kgf, avg.) | The Number of Occurrences of Short-Circuits Between External Electrodes and Ground Electrodes(Ea) |
|---|---|---|---|---|---|---|---|---|---|
| MODEL 1 | 1 | 75 | 152.5 | 75 | 60 | 200 | 60 | 0.289 | 0 |
| | 2 | 100 | 137.5 | 75 | 75 | 200 | 60 | 0.360 | 0 |
| | 3 | 125 | 112.5 | 75 | 100 | 200 | 60 | 0.563 | 0 |
| | 4 | 150 | 92.5 | 75 | 120 | 200 | 60 | 0.865 | 8 |
| | 5 | 180 | 77.5 | 75 | 135 | 200 | 60 | 1.296 | 17 |
| MODEL 2 | 1 | 75 | 152.5 | 75 | 60 | 500 | 60 | 0.252 | 0 |
| | 2 | 100 | 137.5 | 75 | 75 | 450 | 60 | 0.301 | 0 |
| | 3 | 125 | 112.5 | 75 | 100 | 400 | 60 | 0.528 | 0 |
| | 4 | 150 | 92.5 | 75 | 120 | 350 | 60 | 0.877 | 10 |
| | 5 | 180 | 77.5 | 75 | 135 | 290 | 60 | 1.023 | 26 |
| MODEL 3 | 1 | 75 | 227.5 | 75 | 60 | 100 | 60 | 0.207 | 0 |
| | 2 | 100 | 212.5 | 75 | 75 | 100 | 60 | 0.295 | 0 |
| | 3 | 125 | 193.75 | 75 | 93.75 | 100 | 60 | 0.455 | 0 |
| | 4 | 150 | 187.5 | 75 | 100 | 100 | 60 | 0.846 | 0 |
| | 5 | 180 | 167.5 | 75 | 120 | 100 | 60 | 1.008 | 0 |
| MODEL 4 | 1 | 75 | 212.5 | 75 | 60 | 380 | 60 | 0.213 | 0 |
| | 2 | 100 | 187.5 | 75 | 75 | 350 | 60 | 0.499 | 0 |
| | 3 | 125 | 162.5 | 75 | 100 | 300 | 60 | 0.645 | 0 |
| | 4 | 150 | 137.5 | 75 | 120 | 260 | 60 | 1.221 | 0 |
| | 5 | 180 | 107.5 | 75 | 135 | 230 | 60 | 1.447 | 0 |

Sizes of the external electrodes 1420 for fixing the common mode filter 1000 to the insulating substrate 3100, or the like, at predetermined sticking strength may be in proportion to that of the common mode filter 1000.

Therefore, it is preferable that the widths of the external electrodes 1420 are 0.15 times or more the width of the common mode filter 1000. In addition, it is preferable that the lengths of the external electrodes 1420 are 0.15 times or more the length of the common mode filter 1000.

Meanwhile, when the sizes of the external electrodes 1420 are excessively large as compared with the size of the common mode filter 1000, the short-circuit may occur external electrode should be 150 μm or more and a length d of the external electrode should be 120 μm or more in order to secure sticking strength of 0.6 kgf or more. In this case, an interval b between the external electrode and the ground electrode was not sufficiently secured, such that a short-circuit occurrence rate was rapidly increased.

On the other hand, in the case of the common mode filter 1000 according to an embodiment of the present disclosure, it may be confirmed that since the common mode filter 1000 may have a disposition structure in which a distance between the external electrode 1420 and the ground electrode 1430 is maximized, a short-circuit phenomenon may be significantly decreased while the external electrode 1420 and the ground electrode 1430 secure sufficient sizes required for securing the sticking strength.

In addition, in the case of the common mode filter according to Comparative Example 3, a minimum interval e between the external electrodes and an interval b between the ground electrode and the external electrode may be secured at levels similar to those of MODEL 4, which is the common mode filter according to an embodiment of the present disclosure, such that a short-circuit occurrence risk may be decreased. However, it may be confirmed that in the case in which the width or the length of the external electrode has conditions similar to those of MODEL4, sticking strength tends to become lower as compared with MODEL4.

Figure 8:
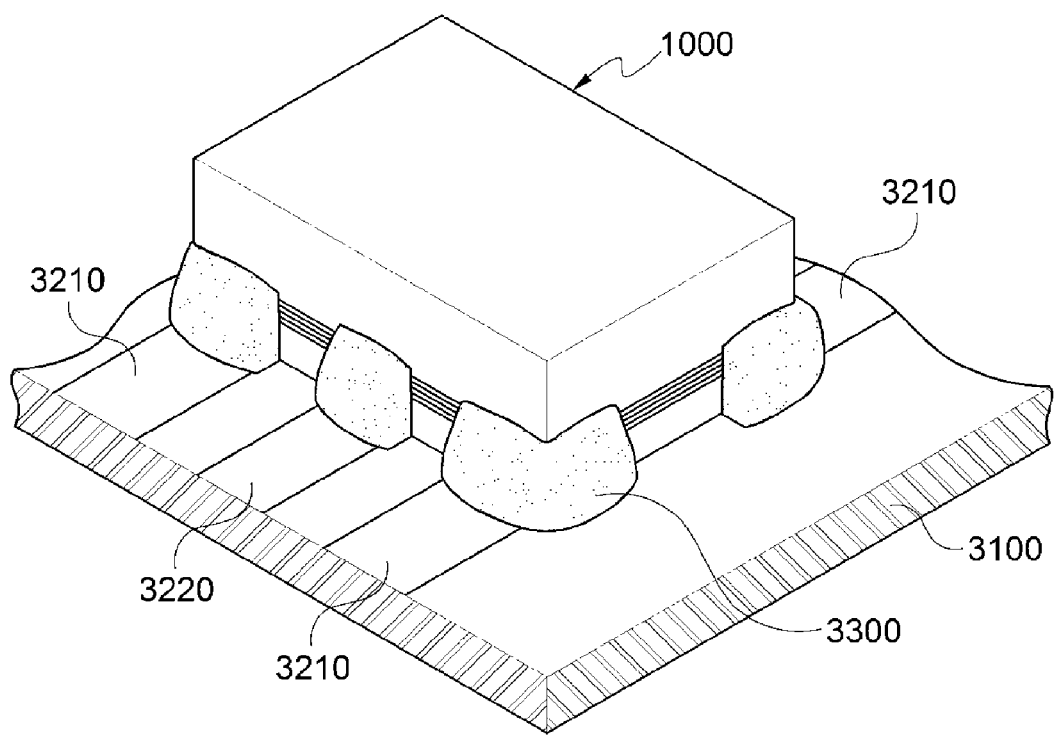
FIG. 8 is a perspective view schematically showing an electronic device including a common mode filter according to an embodiment of the present disclosure.

FIG. 8 is a perspective view schematically showing an electronic device 3000 including a common mode filter according to an embodiment of the present disclosure.

Referring to FIG. 8, the electronic device 3000 including the common mode filter according to an embodiment of the present disclosure may include the common mode filter 1000, signal path patterns 3210, a ground path pattern 3220, and the insulating substrate 3100.

The signal path patterns 3210 for transmitting signals and the ground path pattern 3220 may be formed on a surface of the insulating substrate 3100.

In addition, the external electrodes 1420 of the common mode filter 1000 may be electrically connected to the signal path patterns 3210, and the ground electrodes 1430 of the common mode filter 1000 may be electrically connected to the ground path pattern 3220. Further, solder pastes 3300 may be further provided between the external electrodes 1420 and the signal path patterns 3210 and between the ground electrodes 1430 and the ground path pattern 3220.

Here, as sizes of the external electrodes 1420 and the ground electrodes 1430 become large, the common mode filter 1000 may be firmly fixed to the insulating substrate 3100. However, the common mode filters 1000 according to the related art has a limitation in increasing sizes of the external electrodes 1420 in a range in which a short-circuit phenomenon between the external electrode 1420 and the ground electrode 1430 does not occur. However, since the common mode filter 1000 according to an embodiment of the present disclosure described above has a structure in which an interval between the external electrode 1420 and the ground electrode 1430 may be maximized, the sizes of the external electrodes 1420 and the ground electrodes 1430 may be sufficiently secured. Therefore, in the electronic device 3000 including the common mode filter according to an embodiment of the present disclosure, signal transmission efficiency may be improved, an over-voltage may be efficiently removed at the time of generation of static electricity, and the common mode filter 1000 may be firmly fixed.

With the common mode filter according to an various embodiments of the present disclosure configured as described above, since the distances between the external electrodes and the ground electrodes may be maximized, the widths of the electrodes may be maximized without occurrence of the short-circuit phenomenon between the electrodes under the same condition.

Therefore, the common mode filter may be firmly stuck to the insulating substrate, or the like, the signal transmission efficiency may be improved, and the short-circuit phenomenon may be minimized.

In addition, with the electronic device including the common mode filter according to an various embodiments of the present disclosure, the common mode filter may be firmly stuck to the electronic device, the signal transmission efficiency may be improved, and a defect due to the short-circuit phenomenon, or the like, may be minimized.

What is claimed is:

1. A common mode filter including a discharge part and a coil part provided between a pair of magnetic materials and having a hexahedral shape, the discharge part discharging an over-voltage applied between discharge patterns and ground patterns and the coil part including coils formed by disposing conductive patterns in a spiral shape, the common mode filter comprising:
    at least four external electrodes electrically connected to the coils and the discharge patterns; and
    at least two ground electrodes connected to the ground patterns,
    wherein at least one surface of each of the external electrodes and at least one surface of each of the ground electrodes are exposed to a first surface of the common mode filter, the first surface being one surface of six surfaces of the common mode filter, and
    at least one edge of at least two of the external electrodes and at least one edge of at least one of the ground electrodes contact a first edge of the first surface.

2. The common mode filter according to claim 1, wherein at least one edge of each of the external electrodes that do not contact the first edge of the first surface and at least one edge of each of the ground electrodes that do not contact the first edge of the first surface contact a second edge of the first surface that opposes the first edge.

3. The common mode filter according to claim 2, wherein the first surface includes a third edge and a fourth edge each having a length shorter than a length of the first edge.

4. The common mode filter according to claim 3, wherein each of the edges of the external electrodes that contact either the first edge or the second edge of the first surface have a length longer than each of the edges of the external electrodes that do not contact the first edge or the second edge of the first surface.

5. The common mode filter according to claim 3, wherein at least one edge of each of the external electrodes contacts either the third edge or the fourth edge of the first surface.

6. The common mode filter according to claim 5, wherein at least one of the external electrodes includes:
    a surface exposed to at least one of a fifth surface of the common mode filter and a sixth surface of the common mode filter, wherein the third edge of the first surface is shared between the fifth surface and the first surface, and the fourth edge of the first surface is shared between the sixth surface and the first surface; and
    another surface exposed to a third surface of the common mode filter, wherein the first edge of the first surface is shared between the third surface and the first surface.

7. The common mode filter according to claim 2, wherein at least one edge of each of the external electrodes contacts at least one edge of the first surface other than the first edge and the second edge.

8. The common mode filter according to claim 1, wherein at least one of the external electrodes includes a surface exposed to a third surface of the common mode filter, wherein the first edge of the first surface is shared between the third surface and the first surface.

9. The common mode filter according to claim 1, wherein a ratio between a width and a length of each of the external electrodes is 0.9 to 1.1 times the ratio between a width and a length of the first surface of the common mode filter.

10. The common mode filter according to claim 9, wherein a width of each of the external electrodes in a direction that is in parallel with the first edge of the first surface is 0.15 to 0.4 times the length of the first surface of the common mode filter.

11. The common mode filter according to claim 10, wherein a minimum value of the length of one edge of each of the ground electrodes is 0.15 times or more a length of a shortest side among edges of the first surface of the common mode filter.

12. The common mode filter according to claim 1, wherein the discharge part includes:
- connecting electrodes electrically connected to the discharge patterns;
- ground terminals contacting the at least two ground electrodes; and
- a connection pattern electrically connecting the ground terminals and the ground patterns to each other,
- the connection pattern, the discharge patterns, and the ground patterns being provided outside a vertical projection region of a region in which the coils are formed in the coil part.

13. An electronic device comprising:
- the common mode filter according to claim 1;
- signal path patterns to which each of the external electrodes of the common mode filter is electrically connected;
- a ground path pattern to which each of the ground electrodes of the common mode filter is electrically connected; and
- an insulating substrate having the signal path patterns and the ground path pattern provided thereon.

14. The electronic device according to claim 13, further comprising conductive solder pastes electrically connecting each of the external electrodes to the signal path patterns, electrically connecting each of the ground electrodes to the ground path pattern, and physically fixing the common mode filter to the insulating substrate.

15. A common mode filter comprising:
- a coil part disposed in a body of the common mode filter;
- four external electrodes connected to the coil part and disposed on the body of the common mode filter; and
- two ground electrodes disposed on the body of the common mode filter,
- wherein a first surface of the body of the common mode filter includes a first edge, a second edge opposing the first edge, a third edge, and a fourth edge opposing the third edge,
- at least one surface of each of the external electrodes and at least one surface of each of the ground electrodes are exposed to the first surface of the body of the common mode filter,
- at least one edge of two of the external electrodes and at least one edge of one of the ground electrodes contact the first edge of the first surface,
- at least one edge of two of the external electrodes that do not contact the first edge of the first surface and at least one edge of one of the ground electrodes that does not contact the first edge of the first surface contact the second edge of the first surface, wherein at least one edge of each of the external electrodes contacts either the third edge or the fourth edge of the first surface, and
- wherein each of the edges of the external electrodes that contact the first edge or the second edge of the first surface has a length longer than a length of each of the edges of the external electrodes that contact the third edge or the fourth edge of the first surface.

16. The common mode filter according to claim 15, wherein each of the first edge and the second edge of the first surface have a length longer than a length of each of the third edge and the fourth edge of the first surface.

17. A common mode filter having a hexahedral shape including a first surface of which at least one horizontal edge is longer than at least one vertical edge, comprising:
- a coil part disposed in the hexahedral shaped common mode filter;
- four external electrodes connected to the coil part and disposed on the hexahedral shaped common mode filter; and
- two ground electrodes disposed on the hexahedral shaped common mode filter,
- wherein the four external electrodes are positioned at four corners of the first surface, respectively, such that two edges of each of the external electrodes are shared with a respective horizontal edge and a respective vertical edge of the first surface,
- each of the two ground electrodes share an edge with a respective horizontal edge of the first surface and are disposed between the external electrodes so as to be spaced apart from the external electrodes, and
- each of the edges of the external electrodes that are shared with the respective horizontal edge of the first surface has a length longer than a length of each of the edges of the external electrodes that are shared with the respective vertical edge of the first surface.

18. A common mode filter comprising:
- a base part made of a magnetic material;
- a coil part provided on the base part and including coils formed by disposing conductive patterns in a spiral shape and external terminals connected to end portions of the coils;
- a discharge part provided on the coil part and including connecting terminals contacting the external terminals, discharge patterns electrically connected to the connecting terminals, ground patterns spaced apart from the discharge patterns by a predetermined interval, and ground terminals electrically connected to the ground patterns; and
- a cover part including external electrodes provided on the discharge part and contacting the connecting terminals, ground electrodes provided on the discharge part and contacting the ground terminals, and a magnetic material part filled between the connecting terminals and the ground terminals to cover the discharge part,
- wherein all of the external electrodes and all of the ground electrodes are exposed to an upper surface of the cover part, and
- horizontal edges of the external electrodes and horizontal edges of the ground electrodes are positioned on horizontal edges on the upper surface of the cover part.

19. The common mode filter according to claim 18, wherein the discharge part further includes a connection pattern electrically connecting the ground terminals and the ground patterns to each other,
- the connection pattern, the discharge patterns, and the ground patterns are provided outside a vertical projection region of a region in which the coils are formed in the coil part.

20. A common mode filter comprising:
- a base part made of a magnetic material;
- a first primary terminal provided at one end of a primary coil;
- a second primary terminal provided at the other end of the primary coil;

a first secondary terminal provided at one end of a secondary coil that is magnetically coupled to the primary coil;
a second secondary terminal provided at the other end of the secondary coil;
a first discharge pattern electrically connected to the first primary terminal;
a second discharge pattern electrically connected to the second primary terminal;
a third discharge pattern electrically connected to the first secondary terminal;
a fourth discharge pattern electrically connected to the second secondary terminal;
a first ground pattern spaced apart from the first discharge pattern by a first predetermined interval;
a second ground pattern spaced apart from the second discharge pattern by a second predetermined interval;
a third ground pattern spaced apart from the third discharge pattern by a third predetermined interval;
a fourth ground pattern spaced apart from the fourth discharge pattern by a fourth predetermined interval;
a connection pattern electrically connected to the first, second, third, and fourth ground patterns; a first ground terminal electrically connected to the connection pattern;
a second ground terminal provided so as to oppose the first ground terminal and electrically connected to the connection pattern;
a first primary external electrode electrically connected to the first primary terminal and the first discharge pattern;
a second primary external electrode electrically connected to the second primary terminal and the second discharge pattern;
a first secondary external electrode electrically connected to the first secondary terminal and the third discharge pattern;
a second secondary external electrode electrically connected to the second secondary terminal and the fourth discharge pattern;
a first ground electrode contacting the first ground terminal;
a second ground electrode contacting the second ground terminal; and
a magnetic material part filled between the first primary external electrode, the second primary external electrode, the first secondary external electrode, the second secondary external electrode, the first ground electrode, and the second ground electrode,
wherein an upper surface and two side surfaces of each of the first primary external electrode, the second primary external electrode, the first secondary external electrode, and the second secondary external electrode are exposed to an outside of the magnetic material part, and
the first ground electrode is positioned between two external electrodes selected from among the first primary external electrode, the second primary external electrode, the first secondary external electrode, and the second secondary external electrode, and the second ground electrode is positioned between the other two external electrodes.

21. The common mode filter according to claim 20, wherein upper surfaces and one side surface of each of the first ground electrode and the second ground electrode are exposed to the outside of the magnetic material part.

22. The common mode filter according to claim 21, wherein two sides each contacting the first ground electrode and the second ground electrode among four sides forming an upper surface of the common mode filter oppose each other.

23. The common mode filter according to claim 22, wherein the two sides each contacting the first ground electrode and the second ground electrode among the four sides forming the upper surface of the common mode filter have a length longer than a length of the other two sides among the four sides forming the upper surface of the common mode filter.

24. The common mode filter according to claim 23, wherein the first ground electrode is positioned between the first primary external electrode and the first secondary external electrode, and
the second ground electrode is positioned between the second secondary external electrode and the second primary external electrode.

* * * * *